United States Patent [19]
Yonemoto

[11] Patent Number: 5,825,056
[45] Date of Patent: Oct. 20, 1998

[54] SCANNING SWITCH TRANSISTOR FOR SOLID STATE IMAGING DEVICE

[75] Inventor: Kazuya Yonemoto, Tokyo, Japan

[73] Assignee: Sony Corporation, Tokyo, Japan

[21] Appl. No.: 618,566

[22] Filed: Mar. 20, 1996

[30] Foreign Application Priority Data

Mar. 22, 1995 [JP] Japan .................................. 7-063103

[51] Int. Cl.⁶ ........................ H01L 31/062; H01L 31/113
[52] U.S. Cl. .......................... 257/290; 257/291; 257/292; 257/443; 257/448
[58] Field of Search ................................ 257/290, 291, 257/448, 443, 292

[56] References Cited

U.S. PATENT DOCUMENTS

| | | | |
|---|---|---|---|
| 4,952,996 | 8/1990 | Nishizawa et al. | 257/448 X |
| 5,285,091 | 2/1994 | Hamasaki | 257/291 X |
| 5,341,008 | 8/1994 | Hynecek | 257/448 X |
| 5,525,813 | 6/1996 | Miyake et al. | 257/292 X |
| 5,563,432 | 10/1996 | Miura et al. | 257/291 |

*Primary Examiner*—William Mintel
*Attorney, Agent, or Firm*—Hill & Simpson

[57] ABSTRACT

A solid-state imaging device can improve a detection sensitivity of a signal means by decreasing a parasitic capacity of a horizontal signal line. In a solid-state imaging device in which a plurality of pixels are arranged in a matrix fashion, a pixel is flowed through a horizontal switch (39) to a horizontal signal line (40) as a signal charge, and a signal is outputted by a signal detecting means connected to the end off the horizontal signal line (40), an insulating gate-type field-effect transistor comprising the horizontal switch (39) includes channels extended at least in two directions between its source electrode connected to the horizontal signal line (40) and drain electrode.

16 Claims, 13 Drawing Sheets

SCANNING SWITCH TRANSISTOR FOR SOLID STATE IMAGING DEVICE

BACKGROUND OF THE INVENTION

The present invention relates to a solid-state imaging device, and more particularly to an amplifying type solid-state imaging device or a solid-state imaging device such as a MOS (metal oxide semiconductor) solid-state imaging device.

As a demand that a solid-state imaging device becomes high in resolution is increased, an internal amplifying type solid-state imaging device has hitherto been developed, and other MOS type solid-state imaging devices also have been known so far.

As the internal amplifying type solid-state imaging device, there are mainly known a static induction transistor (SIT), an amplifying type MOS imager (AMI), a charge-modulation device (CMD), and various imaging device structures such as a BASIS (base-stored image sensor) using bipolar transistors as pixels.

The following amplifying type solid-state imaging device is known as one of such internal amplifying type solid-state imaging devices. This amplifying type solid-state imaging device accumulates photoelectrically-converted holes (signal charges) in a p-type potential well in an n-channel MOS transistor (pixel MOS transistor), and outputs the change of channel current based on a potential fluctuation (i.e., potential change in back gate) in the p-type potential well as a pixel signal.

On the other hand, the assignee of the present application has previously proposed a capacity loaded operation system amplifying type solid-state imaging device in which a sensitivity can be made uniform, a high resolution can be made, and a low power consumption can be realized.

FIG. 1 of the accompanying drawings shows an example of a capacity loaded operation system amplifying type solid-state imaging device. In this amplifying type solid-state imaging device 1, as shown in FIG. 1, light-receiving elements comprising a plurality of unit pixels (cells), e.g., pixel transistors, in this example, pixel MOS transistors 2 are arranged in a matrix fashion. Gates of pixel MOS transistors 2 on every rows are connected to vertical scanning lines 4 selected by a vertical scanning circuit 3 composed of a shift register 4, and drains thereof are connected to a power supply source $V_{DD}$. Their sources at every columns are connected to vertical signal lines 5.

A load capacity element 8 for holding a signal voltage (electric charge) is connected through an operation MOS switch 7 to the vertical signal line 5. An operation pulse $\phi_{OP}$ is applied to the gate of the operation MOS switch 7. The load capacity element 8 is connected to the drain of a horizontal MOS switch 9, and the source of this horizontal MOS switch 9 is connected to a horizontal signal line 10.

In FIG. 1, reference numeral 11 denotes a horizontal scanning circuit comprising a shift register or the like. The horizontal scanning circuit 11 sequentially supplies horizontal scanning pulses $\phi H [\phi H_1, \ldots \phi H_i, \phi H_{i+1}, \ldots]$ to the gates of the horizontal MOS switches 9 connected to the horizontal signal line 10.

A signal detecting means, in this example, a charge detecting circuit 16 comprising an operational amplifier 14 using an inverting amplifier, e.g., a differential amplifier, a detection capacity element 14 and a reset switch 15 is connected to the output terminal of the horizontal signal line 10.

Specifically, the horizontal signal line 10 is connected to an inverting input terminal of the operational amplifier 13 of the charge detecting circuit 16, and a predetermined bias voltage $V_B$ is applied to a non-inverting input terminal of the operational amplifier 13. This bias voltage $V_B$ is used to determine the potential of the horizontal signal line 10. The detection capacity element 14 is connected in parallel to the operational amplifier 13, i.e., the detection capacity element 14 is connected between the inverting input terminal of the operational amplifier 13 and an output terminal $t_1$, and a reset switch for resetting the horizontal signal line 10 and the detection capacity element 14, e.g., MOS transistor 15 is connected in parallel to the detection capacity element 14.

In this amplifying type solid-state imaging device 1, during the horizontal blanking period where reading operation is carried out, vertical scanning signals (i.e., vertical selection pulses) $\phi V [\phi V_1, \ldots \phi V_n, \phi V_{n+1}, \ldots]$ are sequentially applied to the scanning lines 4 of every row from the vertical scanning circuit 3 to sequentially select the pixel MOS transistors 7 of every column. Also, when the operation MOS switch 7 is turned on by the operation pulse $\phi_{OP}$, the pixel MOS transistor 2 and the load capacity element 8 are turned on so that a signal charge is started being charged in the load capacity element 8 from the moment the operation MOS switch 7 is turned on. When the operation MOS switch 7 is turned off after the signal voltage is stabilized sufficiently, a signal voltage corresponding to a channel potential corresponding to the amount of signal charges (amount of holes) accumulated in the pixel MOS transistor 2 is held in the load capacity element 8.

The signal voltage held in the load capacity element 8 is flowed to the horizontal signal line 10 as electric charge when the horizontal MOS switches 9 are sequentially turned on by the horizontal scanning signals (i.e., horizontal scanning pulses) $\phi H [\phi H_1, \ldots \phi H_i, \phi H_{i+1}, \ldots]$ supplied thereto from the horizontal scanning circuit 11 during the horizontal scanning period.

The signal charge flowed to the horizontal signal line 10 is demodulated to the detection capacity element 14 of the charge detecting circuit 16 using the operational amplifier 13 as a signal voltage, and is then outputted to the output terminal $t_1$ as a video signal.

The detection capacity element 14 of the charge detecting circuit 16 turns on and resets the reset switch 15 by a reset pulse $\phi_R$ before the horizontal MOS switch 9 corresponding to the next pixel MOS transistor is turned on.

According to the amplifying type solid-state imaging device 1, when the signal voltage is held in the load capacity element 7, substantially no current is flowed to the vertical signal line 5 so that a uniform sensitivity can be obtained without being affected by a resistance of the vertical signal line 5 very much.

Further, since the load is the capacity element 7, signal charges cannot be fluctuated less unlike the load MOS transistor, and hence a vertical stripe-shaped fixed pattern noise (FPN) is difficult to be generated.

Further, since the channel potential of the pixel MOS transistor 2 becomes a potential held in the load capacity element 8 as it is, a sensitivity can be increased as compared with the case that the pixel MOS transistor is operated in the stationary state by the load MOS transistor, i.e., under the condition that a constant current is flowed to the channel.

Furthermore, a steady-state current is not flowed to the pixel MOS transistor 2, a power consumption can be decreased.

As the horizontal MOS switch 9 of this amplifying type solid-state imaging device 1, there is used a MOS transistor of which the structure is illustrated in FIG. 2.

In the MOS transistor 9, a source region 22S and a drain region 22D are formed on semiconductor regions separated by a field insulating layer (so-called LOCOS oxide layer) 21 provided by selective oxidation, and a gate electrode 23 made of polycrystalline silicon, for example, is formed between the source region 22S and the drain region 22D through a gate insulating film.

The gate electrode 23 is connected to the horizontal scanning circuit 11. A source electrode 24 and a drain electrode 24D are each made of Al, for example, and the drain electrode 24D is connected to the vertical signal line 5 through the operation MOS switch. The source electrode 24S is connected to the horizontal signal line 10. In FIG. 2, reference numeral 26 denotes a contact portion, and 27 an Al interconnection.

With the above-mentioned arrangement, since the source regions 22S of many horizontal switches 9 are connected to the horizontal signal line 10, a parasitic capacity of the horizontal signal line 10 is increased, thus lowering a detection sensitivity of the charge detecting circuit 16.

SUMMARY OF THE INVENTION

In view of the aforesaid aspect, it is an object of the present invention to provide a solid-state imaging device wherein a detection sensitivity can be improved by decreasing a parasitic capacity of a horizontal signal line.

According to an aspect of the present invention, there is provided a solid-state imaging device which is comprised of a plurality of pixels, a plurality of vertical signal lines connected to the plurality of pixels, a plurality of horizontal switches disposed at every vertical signal line, the horizontal switch being composed of an insulating gate type FET (field-effect transistor) having first and second main electrodes, and the main electrode being connected to the vertical signal lines, a horizontal signal line connected to the second main electrode of the horizontal switch, and a signal detector connected to the horizontal signal line for detecting a signal obtained from the pixels, wherein the horizontal switch has channels formed in at least two directions between the first and second main electrodes.

According to other aspect of the present invention, there is provided a solid-state imaging device which is comprised of a plurality of pixels each generating a signal corresponding to an amount of incident light, a signal detector for detecting a signal obtained from the pixel, and a switch composed of an insulating gate-type FET (field-effect transistor) having a channel formed between first and second main electrodes, the first main electrode being connected to the pixel, and the second main electrode being connected to the signal detector, wherein the switch is arranged such that an area of the first main electrode in contact with the channel is larger than an area of the second main electrode in contact with the channel.

In accordance with a further aspect of the present invention, there is provided a solid-state imaging device which is comprised of a plurality of pixels each generating an electrical signal corresponding to an amount of incident light, a capacity connected to the pixel for accumulating signal charges of an amount corresponding to the electrical signal, a signal charge detector for detecting signal charges accumulated in the capacity, and a switch composed of an insulating gate-type FFT (field-effect transistor) having a channel between first and second main electrodes, the first main electrode being connected to the capacity, and the second main electrode being connected to the signal charge detector, wherein the switch is arranged such that an area of the first main electrode in contact with the channel is larger than an area of the second main electrode in contact with the channel.

DETAILED DESCRIPTION OF THE PREFERRED EMBODIMENTS

Prior to describing the present invention, the principle of the present invention will be summarized below.

A solid-state imaging device according to the present invention is a solid-state imaging device wherein a plurality of pixels area arranged in a matrix fashion, signals of pixels are supplied through horizontal switches to horizontal signal lines as signal charges, and a signal detecting means connected to the end of the horizontal signal lines outputs a signal. An insulating gate-type field effect transistor comprising the horizontal switch is arranged such that a channel between first and second main electrodes connected to the horizontal signal line thereof is formed at least in two directions.

In a solid-state imaging device according to the present invention, horizontal switches corresponding to pixels adjacent in the horizontal directions can be disposed in the upper and lower direction across the horizontal signal line.

In a solid-state imaging device according to the present invention, the solid-state imaging device includes a plurality of horizontal signal lines and wherein horizontal switches corresponding to pixels in horizontal lines can be distributed on respective horizontal signal lines.

In a solid-state imaging device according to the present invention, the solid-state imaging device includes a plurality of signal lines and wherein horizontal switches corresponding to pixels in horizontal lines can be distributed on respective horizontal signal lines and further disposed in the upper and lower direction across each horizontal signal line.

A solid-state imaging device according to the present invention will hereinafter be described with reference to the drawings.

Figure 3:
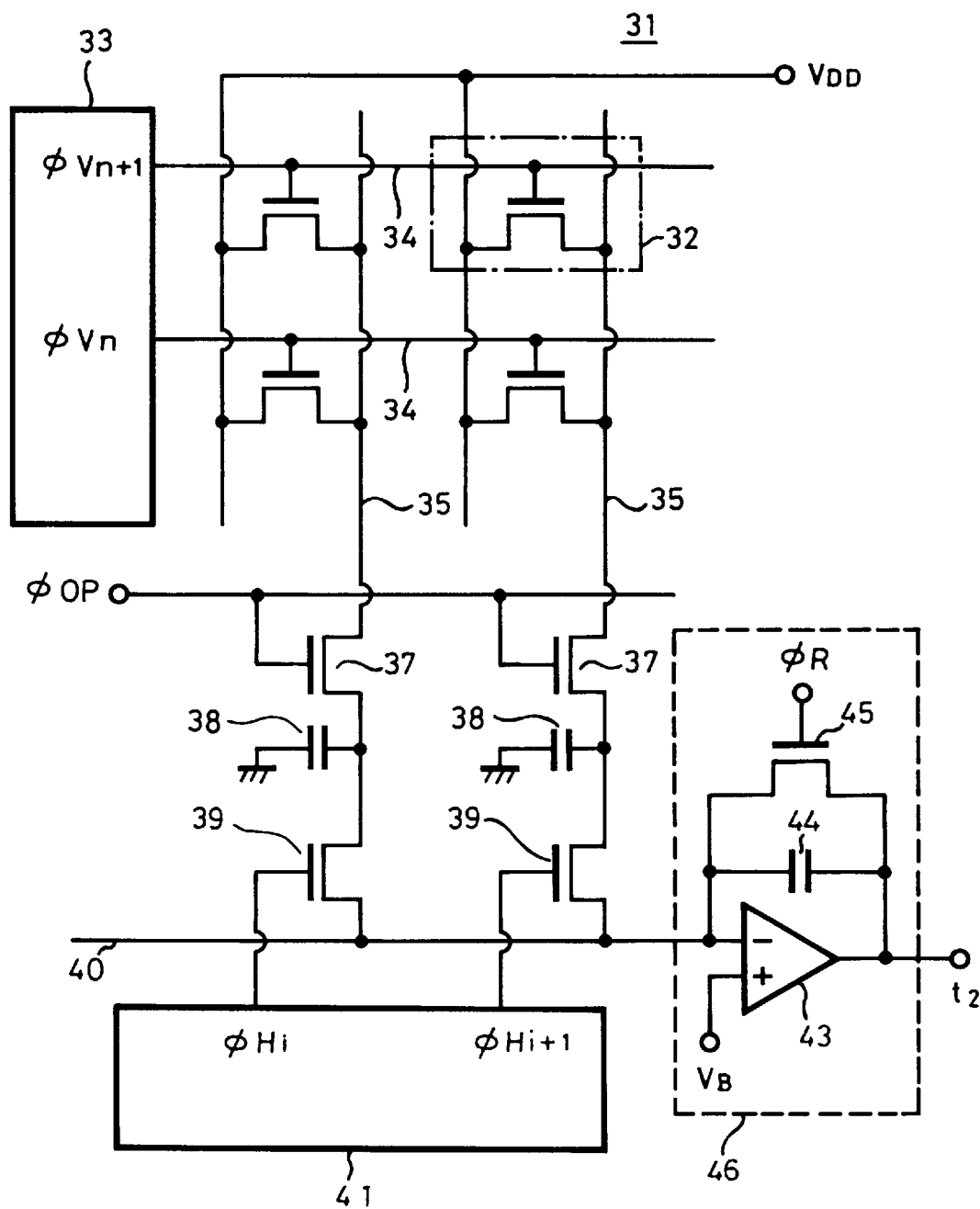
FIG. 3 is a diagram showing an amplifying type solid-state imaging device according to an embodiment of the present invention.
Figure 4:
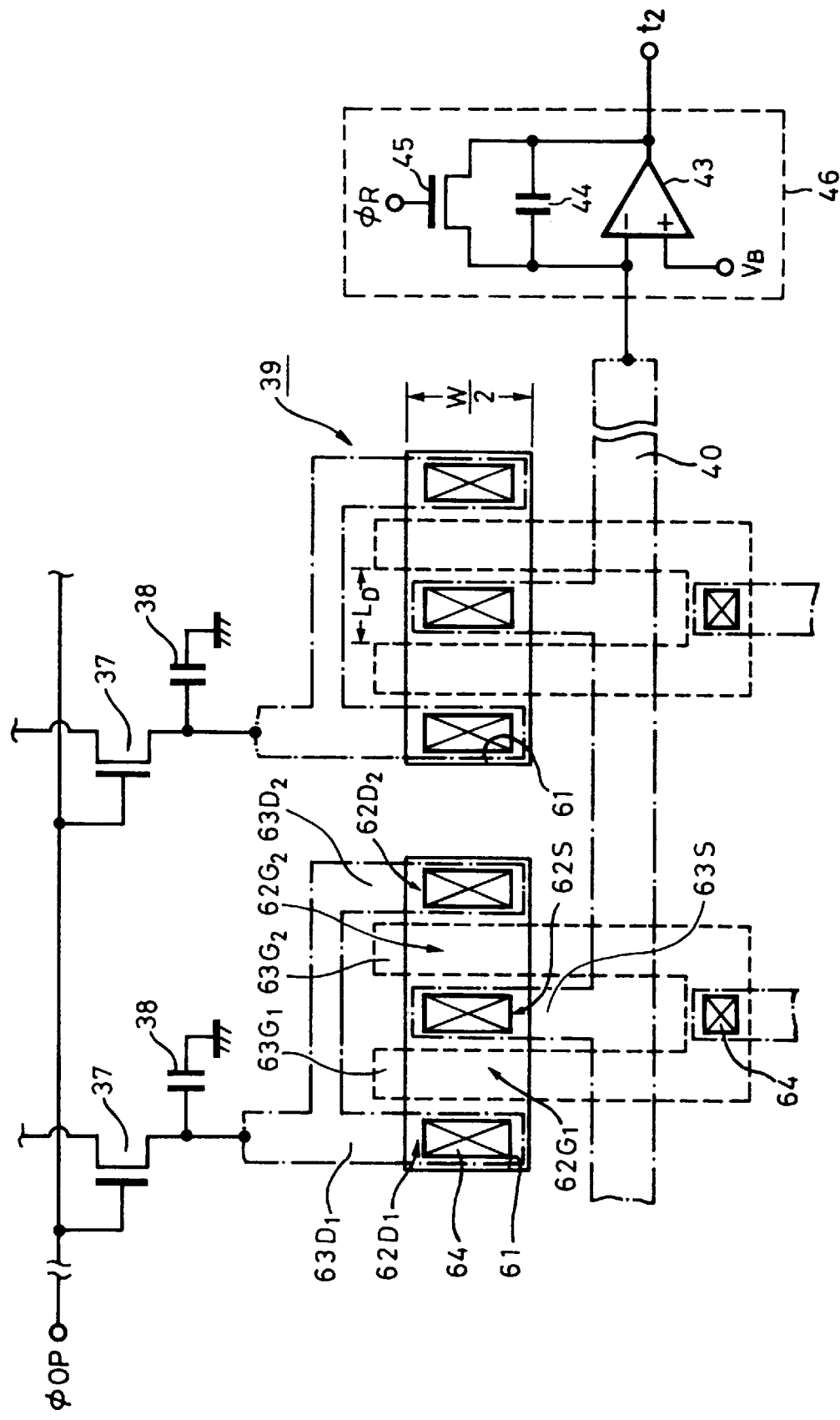
FIG. 4 is a fragmentary plan view illustrating a horizontal MOS switch shown in FIG. 3.

FIGS. 3 and 4 show a solid-state imaging device according to a first embodiment of the present invention which is applied to a load capacity operation system amplifying type solid-state imaging device.

Figure 1:
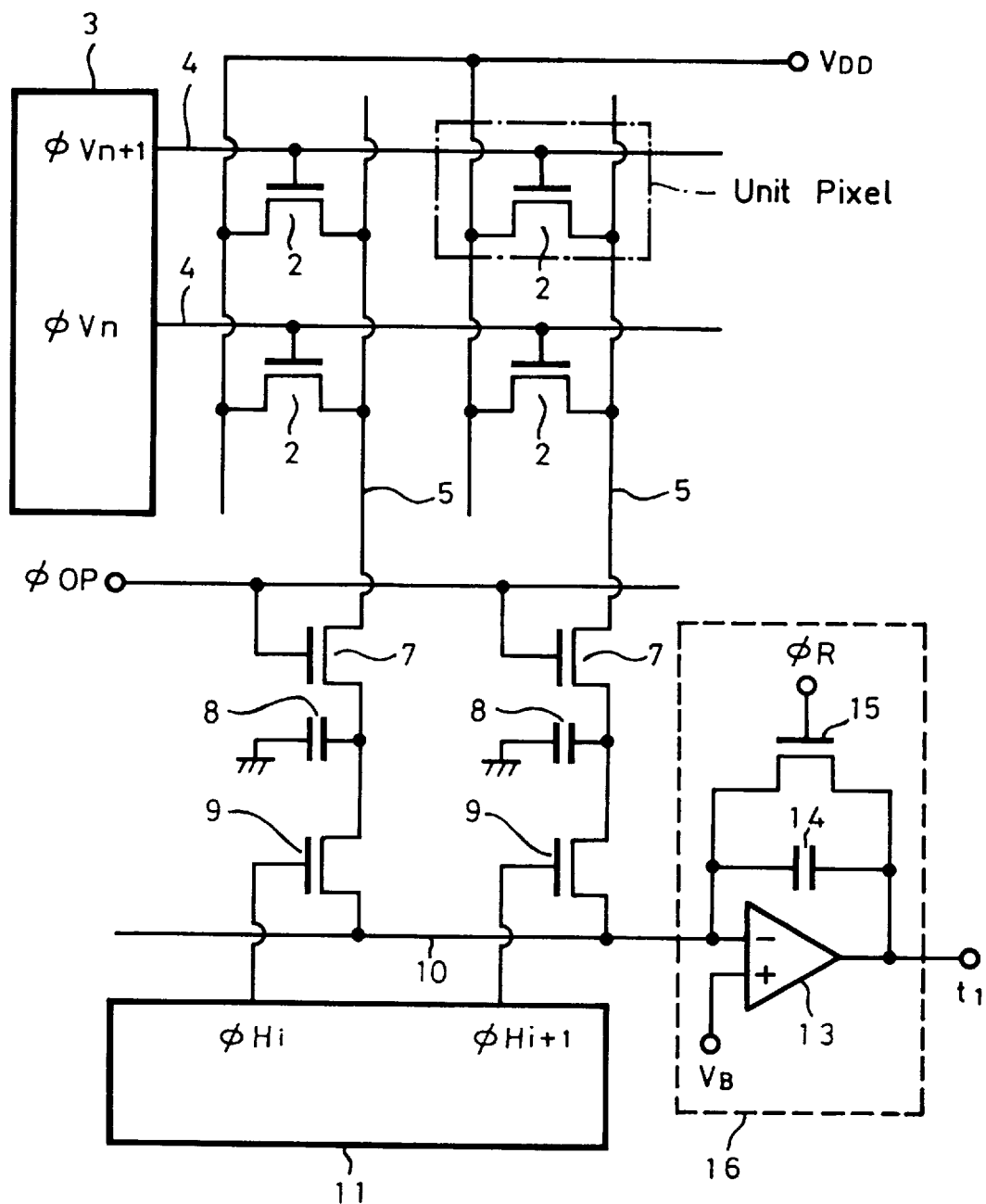
FIG. 1 is a diagram showing an arrangement of an amplifying type solid-state imaging device according to a comparative example.

The solid-state imaging device shown in FIG. 3 has an equivalent circuit arrangement similar to that shown in FIG. 1. In FIG. 3, reference numeral 31 generally denotes an amplifying type solid-state imaging device. Reference numeral 32 denotes a light-receiving element comprising a unit pixel (cell), e.g., pixel transistor, i.e., pixel MOS transistor in this embodiment. A plurality of pixel MOS transistors 32 are arranged in a matrix fashion. Reference numeral 34 denotes vertical scanning lines connected to gates of the pixel MOS transistors 32 provided at every row. The vertical scanning lines 34 are connected to a vertical scanning circuit 33, and supplied with vertical scanning signals, i.e., vertical scanning pulses $\phi V$ [$\phi V_1, \ldots \phi V_n, \phi V_{n+1}, \ldots$] sequentially from the vertical scanning circuit 33. The source of the pixel MOS transistor 32 is connected to a vertical signal line 35 at every column, and the drain thereof is connected to the power supply source $V_{DD}$.

A load capacity element 38 for holding a signal voltage (electric charge) is connected to each vertical signal line 35 through an operation MOS switch 37. Specifically, the load capacity element 38 is connected between the vertical signal line 35 and a first potential, e.g., ground potential in this embodiment, and the operation pulse $\phi_{OP}$ is applied to the gate of the operation MOS switch 37. The load capacity element 38 is connected to the drain of a horizontal switch, i.e., an insulating gate type field-effect transistor (hereinafter referred to as a "horizontal MOS switch") 39, and the source of the horizontal MOS switch 39 is connected to a horizontal signal line 40.

Reference numeral 41 denotes a horizontal scanning circuit comprising a suitable means such as a shift register. The horizontal scanning circuit 41 sequentially supplies the horizontal scanning pulses $\phi H$ [$\phi H_1, \ldots \phi H_i, \phi H_{i+1}, \ldots$] to the gates of the horizontal MOS switches 39 connected to the horizontal signal line 40.

To the output end of the horizontal signal line 40 is connected a signal detecting means, e.g., a charge detecting circuit 46 which comprises an operational amplifier 43 using an inverting amplifier, e.g., a differential amplifier, a detection capacitor element 44 and a reset switch 45.

Specifically, the horizontal signal line 40 is connected to an inverting input terminal of the operational amplifier 43 in the charge detecting circuit 46, and a predetermined bias voltage $V_B$ is applied to a non-inverting input terminal of the operational amplifier 43. The bias voltage $V_B$ is used to determined a potential of the horizontal signal line 40. The detection capacitor element 44 is connected in parallel to the operational amplifier 43, i.e., between the inverting input terminal of the operational amplifier 43 and an output terminal $t_2$, and the reset switch 45 which resets the horizontal signal line 40 and the detection capacitor element 44 is connected in parallel to the detection capacitor element 44.

The reset switch 45 is composed of a MOS transistor, for example, and a reset pulse $\phi_R$ is applied to the gate of the reset switch 45.

The operational amplifier 43 should preferably be composed of a MOS transistor because no input current is flowed to the MOS transistor or an input impedance of the MOS transistor is high.

Figure 5:
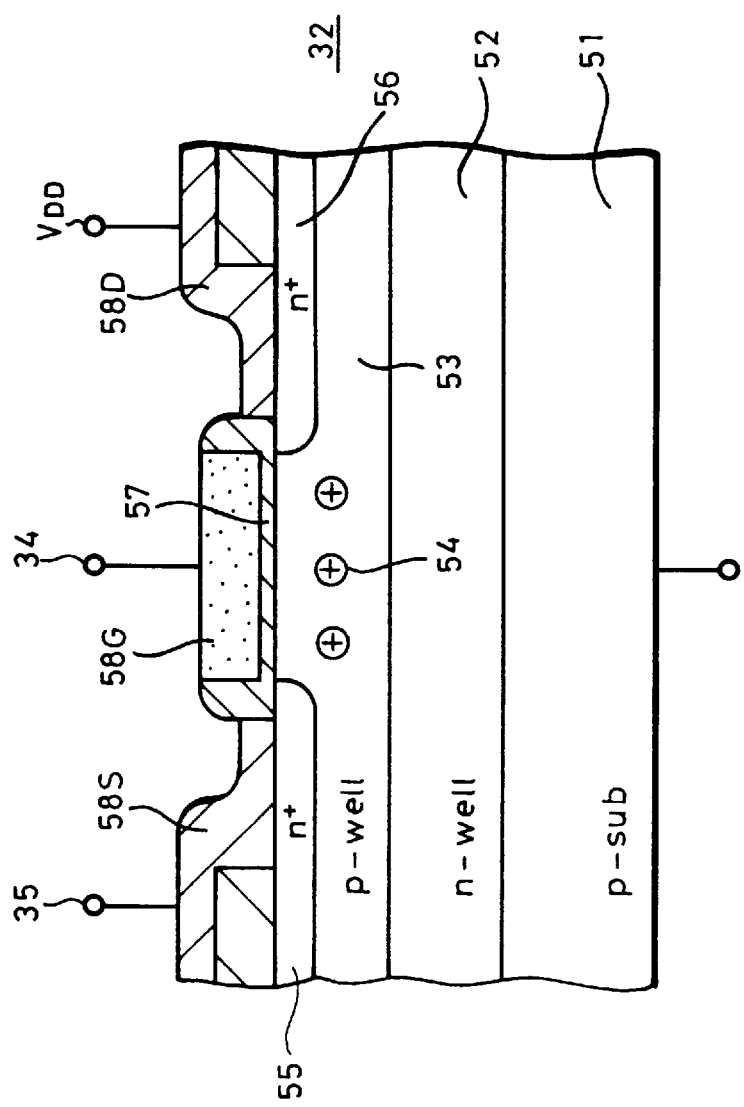
FIG. 5 is a cross-sectional view showing a semiconductor structure of a pixel MOS transistor.

FIG. 5 is a cross-sectional view illustrating a semiconductor structure of the unit pixel (i.e., pixel MOS transistor) 32.

In FIG. 5, reference numeral 51 denotes a first conductivity type, e.g., p-type silicon substrate, 52 a second conductivity type, e.g., n-type well region, and 53 a p-type well region in which photoelectrically-converted holes (signal charges) 54 are accumulated when light is received by this solid-state imaging device.

An n-type source region 55 and a drain region 56 are formed on the p-type well region 53, and a gate electrode 58G made of polycrystalline silicon thin film is formed between the two regions 55 and 56 through a gate insulating film 57. The holes 54 that were accumulated in the p-type well region 53 located under the gate electrode 58G by photoelectric conversion are used to control a channel current (drain current) upon reading operation, and the changed amount of channel current becomes a signal output.

The gate electrode 58G is connected to the vertical scanning line 34, a drain electrode 58D is connected to the power supply source $V_{DD}$, and a source electrode 58S is connected to the vertical signal line 35.

Figure 6:
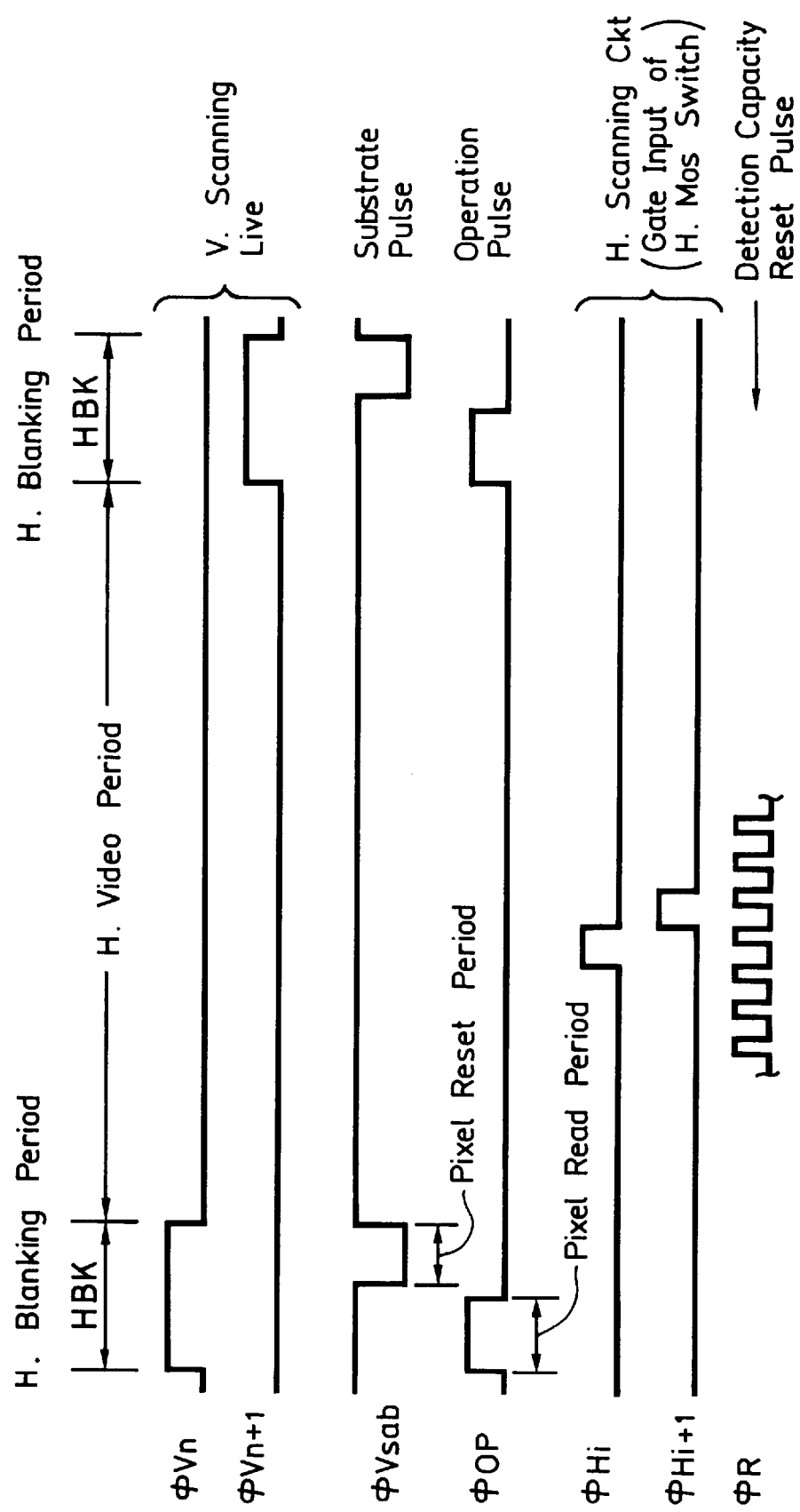
FIG. 6 is a driving timing chart of the amplifying type solid-state imaging device shown in FIG. 3.

FIG. 6 shows a driving timing chart of this amplifying type solid-state imaging device 31.

In the amplifying type solid-state imaging device 31, when the operation MOS switch 37 with a drain connected to the vertical signal line 35 is turned on by application of the operation pulse $\phi_{OP}$ to the gate thereof, a signal voltage from the pixel MOS switch transistor 32 is read out to the load capacity element 38 during the first half of horizontal blanking period HBK. The load capacity element 38 is held at a potential, i.e., voltage corresponding to a channel potential corresponding to an amount of signal charges accumulated in each pixel MOS transistor 32. The signal voltage read out to the load capacity element 38 turns on the horizontal MOS switches 39, which are sequentially scanned by the horizontal scanning circuit 41, during a horizontal video period, and outputted to the horizontal signal line 40.

More specifically, the vertical scanning pulses $\phi V$ [$\phi V_1, \ldots \phi V_n, \phi V_{n+1}, \ldots$] from the vertical scanning circuit 33 are sequentially applied to the scanning lines 34 of respective rows, and the pixel MOS transistors 32 of respective rows are scanned sequentially. When the potential of the vertical scanning pulse $\phi V_n$ applied to the scanning line 34 of nth row, for example, goes to high level, the pixel MOS transistor 32 of the row is placed in the selection state. The potential of the scanning line 34 corresponding to the non-selection goes to low level, and hence the other pixel MOS transistor 32 that is connected to this scanning line 34 is placed in the non-selection state.

When the operation MOS switch 37 is turned on by the operation pulse $\phi_{OP}$, the pixel MOS transistor 32 of the row is energized, and a signal is developed at the terminal of the load capacity element 38 in response to an amount of signal charges (holes) accumulated in the amount of light incident on the pixel MOS transistor 32. Then, when the operation MOS switch 37 is turned off during the horizontal blanking period HBK, a signal voltage corresponding to the channel potential of the pixel MOS transistor 32 is held in the load capacity element 38. This operation is referred to as "capacitor load operation", and is generally carried out during the horizontal blanking period HBK.

The signal charge (electric charge) held in the load capacity element 38 from the pixel MOS transistor 32 when the capacitor load operation is carried out during the horizontal blanking period HBK is sequentially flowed to the horizontal signal line 40 as signal charges because the horizontal MOS switches 39 are sequentially turned on by the horizontal scanning pulses φH [φH$_1$, ... φH$_i$, φH$_{i+1}$, ...] (shown in FIG. 6) from the horizontal scanning circuit 41.

The signal charge flowed to the horizontal signal line 40 is demodulated to the detection capacitor element 44 of the charge detecting circuit 46 using the operational amplifier 43 as a signal voltage, and then outputted to the output terminal t$_2$ as a video signal.

The detection capacitor element 44 in the charge detecting circuit 46 turns on and resets the reset switch 45 by the reset pulse φ$_R$ before the horizontal MOS switch 39 corresponding to the next pixel MOS transistor 32 is turned on. By this reset operation, the horizontal signal line 40 and a voltage across the detection capacitor element 44 are reset to the bias voltage V$_B$. Specifically, after the horizontal MOS switch 39, for example, has been turned on and the signal output of the pixel MOS transistor 32 has been developed at the output terminal t$_2$, when the reset switch 45 is turned on, the detected capacity of the charge detecting circuit 44 is reset, initializes the detection capacity, and becomes ready for detecting the signal output of the next pixel MOS transistor 32.

According to this embodiment, as shown in FIG. 4, in particular, the insulating gate-type field-effect transistor comprising the horizontal switch, i.e., horizontal MOS switch 39 has channel disposed in two directions between first and second main electrodes connected to the horizontal signal line 40. FIG. 4 is a plan view illustrating an example of a layout of the horizontal MOS switch 39.

In the horizontal MOS switch 39 shown in FIG. 4, a source region 62S is disposed at the center of a semiconductor region separated by a field insulating layer (so-called LOCOS oxide layer) 61 formed by selective oxidation, and opposing drain regions 62D$_1$, 62D$_2$ are disposed at both sides of the source region 62S. Gate electrodes 63G$_1$ and 63G$_2$ made of polycrystalline silicon, for example, which are connected through gate insulating films to the horizontal scanning circuit 41, are formed between the source region 62S and the drain region 62D$_1$ and between the source region 62S and the drain region 62D$_2$, respectively.

A source electrode 63S made of Al, for example, connected to the source region 62S is connected to the horizontal signal line 40, and drain electrodes 63D$_1$, 63D$_2$ made of Al, for example, connected to the drain regions 62D$_1$, 62D$_2$ are connected to the common vertical signal line 35. In FIG. 4, reference numeral 64 denotes a contact portion.

In this horizontal MOS switch 39, the drain regions 62D$_1$, 62D$_2$ are disposed across the source region 62S in an opposing relation to each other, and the channel between the source and drain is formed in the two directions. In other words, the area of the source region 62S is reduced to about ½ of that obtained in the comparative example shown in FIG. 1.

The amount of signal charges developed at the output terminal t$_2$ of the charge detecting circuit 46 greatly depends on a parasitic capacity C$_B$ of the horizontal signal line 40.

Figure 7:
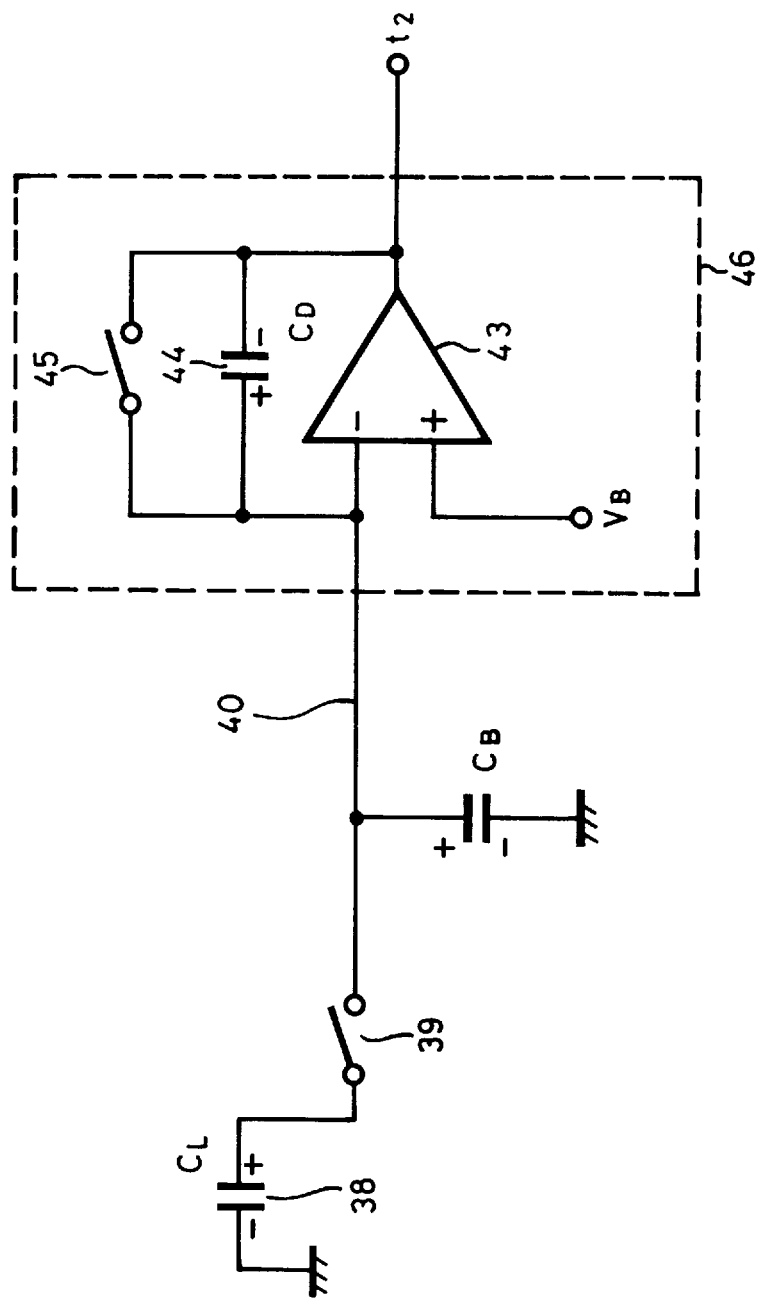
FIG. 7 is an equivalent circuit diagram used to explain the present invention.

Specifically, in the equivalent circuit shown in FIG. 7, C$_L$ assumes a capacity of load capacity element 38, C$_B$ assumes the parasitic capacity of the horizontal signal line 40, C$_n$ assumes a capacity of the detection capacity element 44 of the charge detecting circuit 46, -G assumes a gain of the operational amplifier 43, V$_{sig}$ assumes a signal voltage held in the load capacity element 38, and V$_{out}$ assumes an output signal from the charge detecting circuit 46. Then, a detection sensitivity (i.e., gain of the charge detecting circuit 46) G$_{ain}$ of the output signal V$_{out}$ relative to the signal voltage V$_{sig}$ is expressed by the following equation (1):

$$G_{ain} \propto \frac{C_L}{C_n + \frac{1}{G}(C_B + C_L + C_n)} \quad (1)$$

In the above equation (1), since the parasitic capacity C$_B$ of the horizontal signal line 40 occupies most of the source capacity of the horizontal MOS switch 39, if the parasitic capacity C$_B$ is reduced, then a sensitivity of the solid-state imaging device can be improved.

Figure 2:
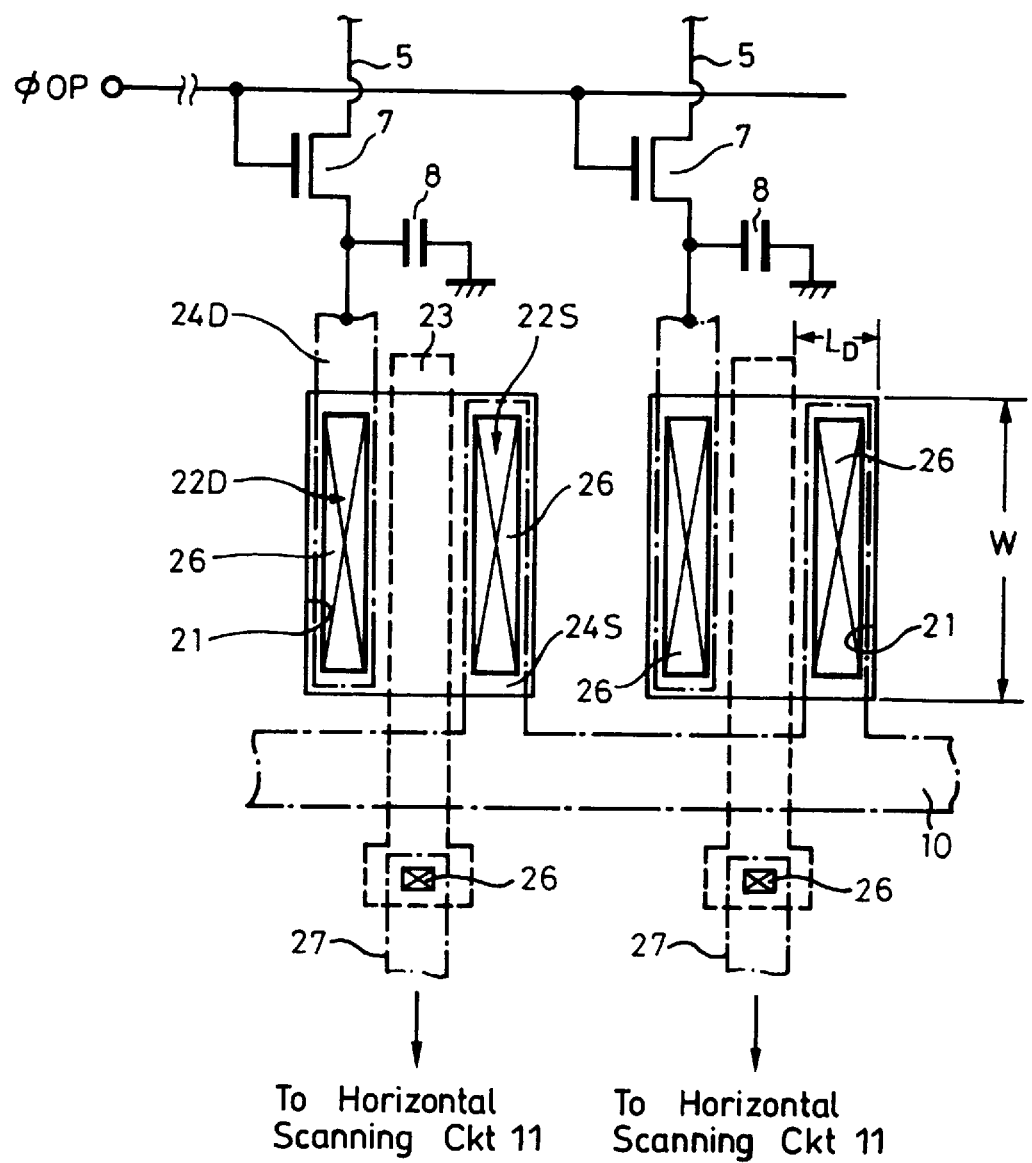
FIG. 2 is fragmentary plan view illustrating a horizontal MOS switch shown in FIG. 1.

According to the solid-state imaging device 31 according to this embodiment shown in FIGS. 3 and 4, the area of source region 62S of the horizontal MOS switch 39 connected to the horizontal signal line 40 is reduced to about half as compared with the area of source region of the horizontal MOS switch 9 in the comparative example shown in FIG. 2. Furthermore, a length of the source region 62S in contact with the field insulating layer 61 is reduced considerably, and hence a source junction capacity can be reduced considerably.

Having compared a source capacity C$_{source}$ of the embodiment shown in FIG. 4 with that of FIG. 2, a compared result is illustrated on the table 1 below.

TABLE 1

| | comparative example (example of FIG. 2) | inventive example (example of FIG. 4) |
|---|---|---|
| expression for calculating source capacity | ≅ C$_j$ × L$_D$ × W + C$_{jsw}$ × (2L$_D$ + W) + C$_{gso}$ × W | ≅ C$_j$ × L$_D$ × $\frac{W}{2}$ + C$_{jsw}$ × 2L$_D$ + C$_{gso}$ × W |
| specific example | 15 [fF] | 7.2 [fF] |

Figure 8:
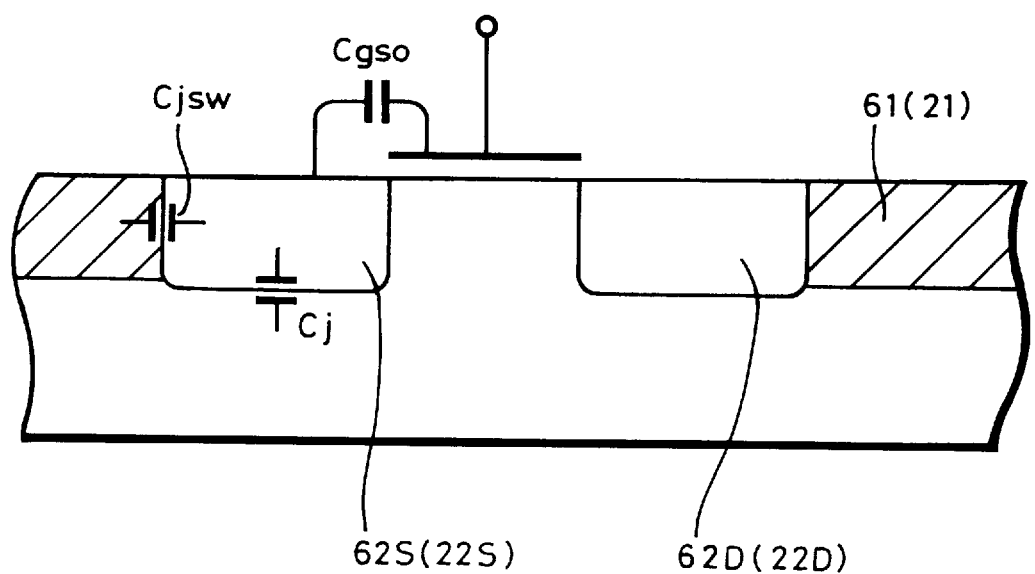
FIG. 8 is a schematic diagram used to explain a source capacitor.

However, as shown in FIG. 8, C$_j$ represents the one-dimensional junction capacity of the source region 62S (22S), C$_{jsw}$ the lateral-direction junction capacity of the field insulating layer 61 (21) of the source region 62S (22S), and C$_{gso}$ the capacity between the source and the gate, respectively. L$_D$ is the source width, and W is the channel width (see FIG. 2).

In the calculation of specific example, Cj=5×10$^{-4}$ F/m$^2$, C$_{jsw}$=3×10$^{-10}$ F/m, C$_{gso}$=1×10$^{-10}$ F/m, W=10 μm, and L$_D$=2 μm.

Assuming now that 80% of the parasitic capacity of the horizontal signal line is occupied by the source capacity of the horizontal MOS switch, then when the horizontal MOS switch 39 of the embodiment shown in FIG. 4 is employed, the parasitic capacity C$_B$ of the horizontal signal line 40 is decreased by about 40% under conditions on the above table 1.

By way of example, if the capacity C$_L$ of the load capacity element 38 (8) is 1 pF, the capacity C$_n$ of the detection capacity element 44 (14) is 1 pF, the parasitic capacity $C_B$ of FIG. 7 is 10 pF, and the gain -G of the differential amplifier 43 (13) ia 20, then according to the aforesaid equation(1), a calculated result of the comparative example shown in FIG. 2 becomes 0.62, and a calculated result of the inventive example of FIG. 4 becomes 0.714. Thus, a sensitivity can be increased by 14%.

In actual practice, if the parasitic capacity $C_B$ of the horizontal signal line 40 is decreased, then the channel width of the horizontal MOS switch 39 may be reduced concurrently therewith. Therefore, the source capacity of the horizontal MOS switch 39 is decreased, and hence a sensitivity can be improved much more.

Since the horizontal MOS switch 39 according to this embodiment includes two drains and two gates for one source, the width of the horizontal MOS switch 30 in the horizontal direction is increased. As a result, it is frequently observed that one horizontal MOS switch cannot be inserted into the horizontal pitch of the pixel MOS transistor 32.

Figure 9:
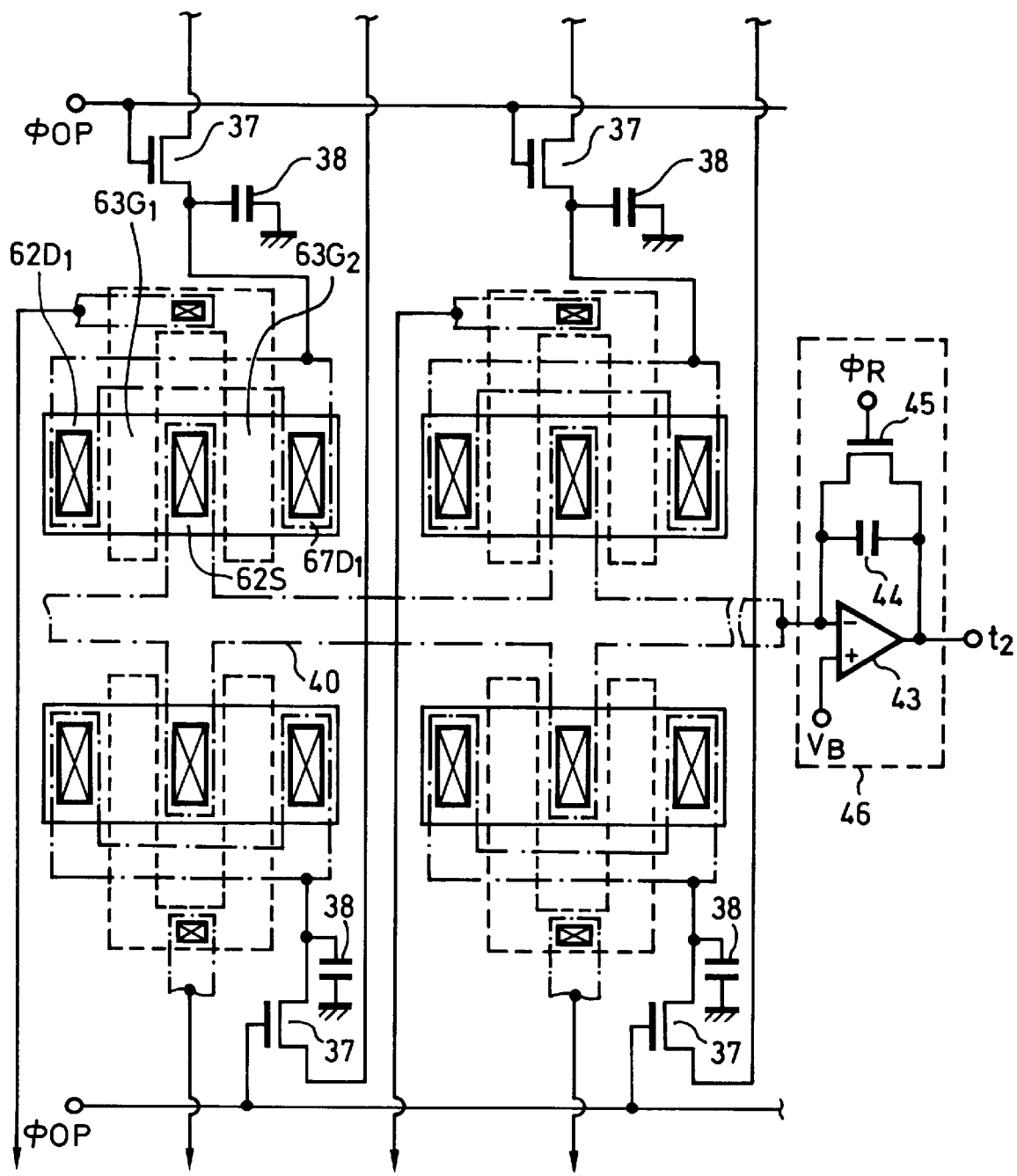
FIG. 9 is a fragmentary plan view showing a layout pattern of a horizontal MOS switch according to a second embodiment of the present invention.

FIG. 9 shows a second embodiment which can improve the above disadvantage of the first embodiment.

In the second embodiment, horizontal MOS switches 30 corresponding to pixel MOS transistors 32 adjacent in the horizontal direction are disposed across one horizontal signal line 40 in the upper and lower directions. Specifically, each horizontal MOS switch corresponding to every other pixel MOS transistor 32 in the horizontal direction is disposed above the horizontal signal line 40 and connected to the horizontal signal line 40, and each horizontal MOS switch 39 corresponding to another every other pixel MOS transistor 32 is disposed under the horizontal signal line 40 and connected to the horizontal signal line 40.

A structure of the horizontal MOS switch 39 is the same as that shown in FIG. 4. The layout pattern of the horizontal MOS switch according to the second embodiment shown in FIG. 9 becomes advantageous when the horizontal pitch of the pixel MOS transistor 32 is narrow.

Figure 10:
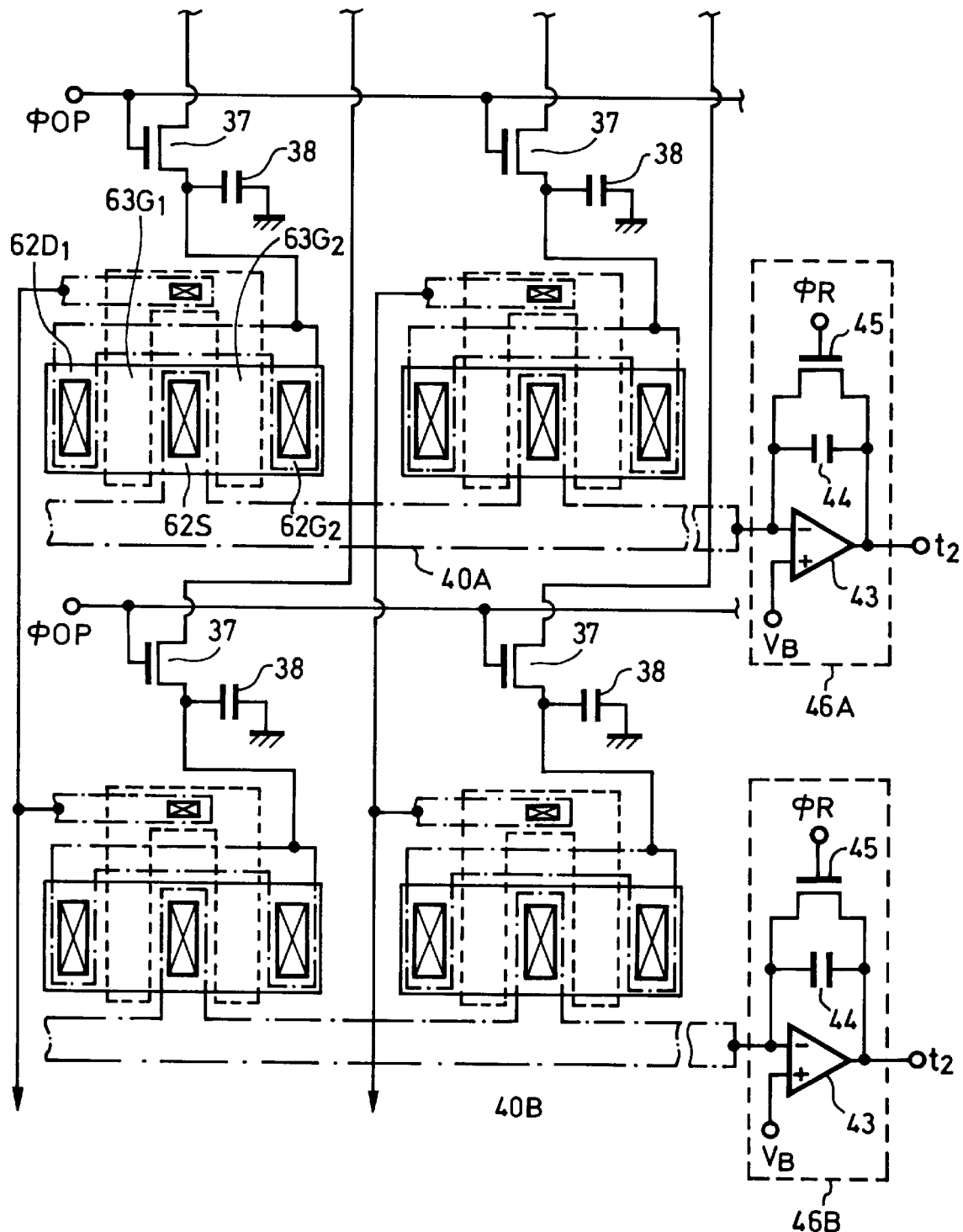
FIG. 10 is a fragmentary plan view showing a layout pattern of a horizontal MOS switch according to a third embodiment of the present invention.

FIG. 10 shows a layout of horizontal MOS switch according to a third embodiment obtained when the horizontal pitch of the pixel MOS transistor 32 is narrower than the width of the horizontal MOS switch 39. According to this embodiment, there are prepared a plurality of, i.e., two horizontal signal lines 40A and 40B, and the horizontal MOS switches 39 corresponding to the pixel MOS transistors 32 adjacent in the horizontal direction are separately connected to the first and second horizontal signal lines 40A and 40B.

Specifically, the horizontal MOS switches 39 corresponding to every other pixel MOS transistors 32 in the horizontal direction and the horizontal MOS switches 39 corresponding to another every other pixel MOS transistors 32 are disposed in two stages. The horizontal MOS switches 39 in the first stage are connected to the first horizontal signal line 40A, and the horizontal MOS switches 39 in the second stage are connected to the second horizontal signal line 40B.

A transistor structure of the horizontal MOS switch is similar to that of FIG. 4.

Ends of the two horizontal signal lines 40A, 40B may be connected electrically, and may be inputted to one charge detecting circuit 46 or each charge detecting circuit 46 may be connected to the horizontal signal lines 40A, 40B (so-called two-line output). In this embodiment, charge detecting circuits 46A and 46B are connected to the horizontal signal lines 40A and 40B, respectively.

According to this embodiment, even when the horizontal pitch of the pixel MOS transistor 32 is narrower than the width of the horizontal MOS switch 39, the horizontal MOS switches can be arranged, and the solid-state imaging device according to the present invention can be suitable for high-density packing. If the charge detecting circuit 46 is prepared for each of the horizontal signal lines 40 [40A and 40B], then a clock frequency of the horizontal scanning circuit 41 can be lowered to the half, and hence the frequency characteristic of the charge detecting circuit 40 can be lowered, thereby making it possible to improve an S/N (signal-to-noise ratio).

Figure 11:
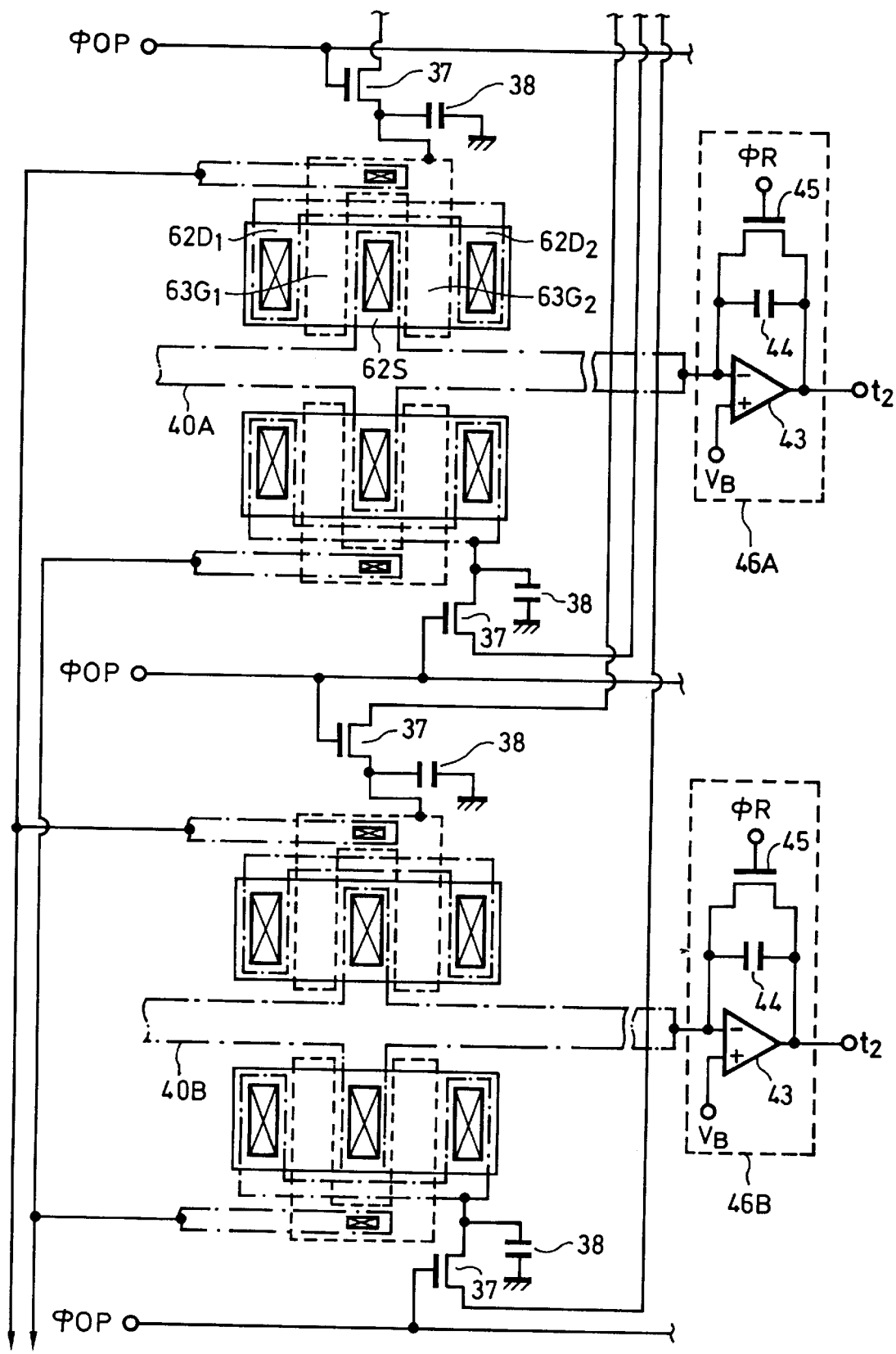
FIG. 11 is a fragmentary plan view showing a layout pattern of a horizontal MOS switch according to a fourth embodiment of the present invention.

FIG. 11 shows a layout pattern of the horizontal MOS switch 39 according to a fourth embodiment of the present invention.

The layout pattern according to this embodiment is a combination of the layout patterns of FIGS. 9 and 10. As shown in FIG. 11, there are prepared a plurality of, in this embodiment, two horizontal signal lines 40A and 40B. Then, horizontal MOS switches 39 corresponding to first every other three pixel transistors in the horizontal direction are disposed in the upper direction across the first horizontal signal line 40A, horizontal MOS switches 39 corresponding to second every other three pixel MOS transistors are disposed in the upper direction across the second horizontal signal line 40B, horizontal MOS switches 39 corresponding to third every other three pixel MOS transistors are disposed in the lower direction across the first horizontal signal line 40A, and horizontal MOS switches 39 corresponding to fourth every other three pixel MOS transistors are disposed in the lower direction across the second horizontal signal line 40B.

The horizontal MOS switches 39 disposed in the upper and lower directions of the first horizontal signal line 40A are connected to the first horizontal signal line 40A, and the horizontal MOS switches 39 disposed in the upper and lower directions of the second horizontal signal line 40B are connected to the second horizontal signal line 40B. The gates of the horizontal MOS switches 39 disposed above the first and second horizontal signal lines 40A and 40B are connected in common, and further connected to the horizontal scanning circuit 41. The gates of the horizontal MOS switches 39 disposed under the first and second horizontal signal lines 40A and 40B are connected in common, and further connected to the horizontal scanning circuit 41. The structure of the horizontal MOS switch 39 is the same as that of FIG. 4.

The ends of the two horizontal signal lines 40A and 40B may be connected electrically, and inputted to one charge detecting circuit 46. Alternatively, each charge detecting circuit 46 may be connected to the two horizontal signal lines 40A and 40B. In this embodiment, charge detecting circuits 46A and 46B are connected to the two horizontal signal lines 40A and 40B.

According to the layout pattern of this embodiment, the solid-state imaging device can be applied to the case that the horizontal pitch of the pixel MOS transistor is further narrowed.

According to the above embodiment, since the source capacity of the horizontal MOS switch 30 connected to the horizonal signal line 40 is decreased considerably, a detection sensitivity can be increased. In other words, the gain of the charge detecting circuit 46 can be increased, and hence the S/N ratio can be improved.

Figure 12:
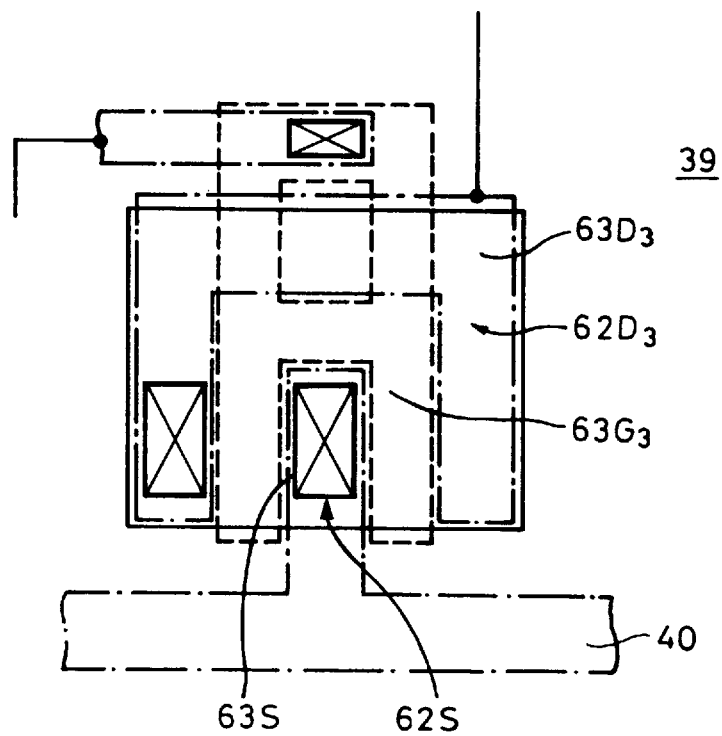
FIG. 12 is a fragmentary plan view showing a layout pattern of a horizontal MOS switch according to a fifth embodiment of the present invention.
Figure 13:
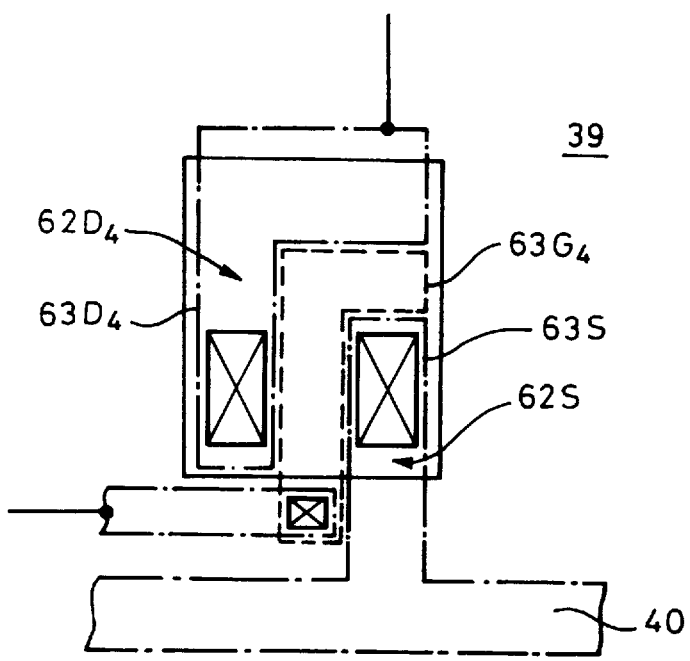
FIG. 13 is a fragmentary plan view showing a layout pattern of a horizontal MOS switch according to a sixth embodiment of the present invention.
Figure 14:
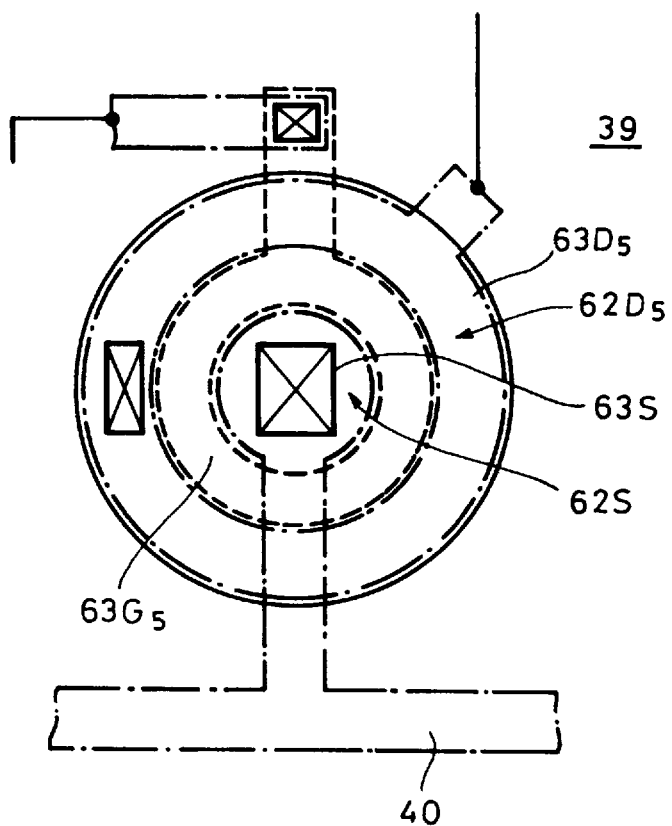
FIG. 14 is a fragmentary plan view showing a layout pattern of a horizontal MOS switch according to a seventh embodiment of the present invention.

While the horizontal MOS switch 39 has such transistor structure that the drain regions $62D_1$, $62D_2$ are disposed at both sides of the central source region 62S to provide the channels in the two directions as described above, the principle of the present invention can also be applied to other transistor structures shown in FIGS. 12, 13 and 14.

In a horizontal MOS switch 39 shown in FIG. 12, an inverse U-letter shaped drain region 62D$_3$ is continuously formed in an opposing relation to both sides and upper side of the center source region 62S, and a gate electrode 63G$_3$ is formed between the two regions 62S and 62D$_3$ through a gate insulating film, thereby forming a channel in the three directions. In FIG. 12, reference numeral 63S denotes a source electrode, and 63D$_3$ a drain electrode, respectively.

In a horizontal MOS switch 39 shown in FIG. 13, an inverse L-letter shaped drain region 62D$_4$ is formed in an opposing relation to one side portion and upper side portion of the source region 62S, and a gate electrode 63G$_4$ is formed between the two regions 62S and 62D$_4$ through the gate insulating film, thereby forming channels in the two directions. In FIG. 13, reference numeral 63S denotes a source electrode, and 63D$_4$ denotes a drain electrode, respectively.

In a horizontal MOS switch 39 shown in FIG. 14, a drain region 62D$_5$ is formed so as to surround the source region 62S, and a gate electrode 63G$_5$ is formed between the two regions 62S and 62D$_5$ through a gate insulating film, thereby forming a channel in the direction of 360°. In FIG. 14, reference numeral 63S denotes a source electrode, and 63D$_5$ denote a drain electrode, respectively.

In case the horizontal MOS switches 39 have the transistor structures shown in FIGS. 12 to 14, then the source capacity can be decreased as compared with the aforesaid comparative example, and the parasitic capacity $C_B$ of the horizontal signal line 40 can be lowered, thereby making it possible to improve a detection sensitivity.

While the amplifying type solid-state imaging device according to the present invention uses the charge detecting circuit 46 as the signal detecting means connected to the horizontal signal line, the present invention is not limited thereto, and a signal charge may be reconverted by an amplifier with a base grounded or a load resistor into a voltage.

Further, while the present invention is applied to the capacitor load operation system amplifying type solid-state imaging device, the principle of the present invention can also be applied to other amplifying type solid-state imaging device and MOS type solid-state imaging device, etc.

According to the solid-state imaging device of the present invention, the source capacity of the horizontal switch connected to the horizontal signal line can be decreased considerably, and hence the detection sensitivity, i.e., gain of the signal detecting means can be increased, thereby improving the S/N.

According to the solid-state imaging device of the present invention, when the horizontal switches corresponding to the pixels adjacent in the horizontal direction are disposed in the upper and lower direction across the horizontal signal line, the horizontal pitch of the pixels can be narrowed.

Further, according to the solid-state imaging device of the present invention, since the horizontal switches having a plurality of horizontal signal lines and which correspond to horizontal pixels are distributed to and connected to respective horizontal signal lines, even when the horizontal pitch of pixels is narrower than the width of horizontal switch, the horizontal switches can be arranged.

Furthermore, according to the solid-state imaging device of the present invention, when the horizontal switches having a plurality of horizontal signal lines and which correspond to the pixels of horizontal line are distributed to and connected to a plurality of horizontal signal lines and disposed in the upper and lower directions across each horizontal signal line, even if the horizontal pitch of pixels is further narrowed, then horizontal switches can be arranged.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid-state imaging device comprising:
   a plurality of pixels each generating a signal corresponding to an amount of incident light;
   a signal detector for detecting a signal obtained from individual ones of said pixels; and
   a switch comprised of an insulating gate-type FET (field-effect transistor) having a channel formed between first and second main electrodes, said first main electrode being connected to at least one of said pixels, and said second main electrode being connected to said signal detector, wherein said switch is arranged such that an area of said first main electrode in contact with said channel is larger than an area of said second main electrode in contact with said channel, and having first and second drain regions located only at opposed sides of a source region.

2. A solid-state imaging device according to claim 1, wherein said first main electrode is disposed on both sides of said second main electrode across said channel.

3. A solid-state imaging device according to claim 1, wherein said second main electrode has at least four sides, and said first main electrode is disposed so as to surround at least two sides of said second main electrode across said channel.

4. A solid-state imaging device according to claim 1, wherein said first main electrode is disposed so as to surround most of said second main electrode.

5. A solid-state imaging device according to claim 1, wherein said first main electrode is disposed so as to completely surround said second main electrode.

6. A solid-state imaging device according to claim 1, wherein said signal detector includes an operational amplifier, said horizontal signal line is connected to a first input terminal of said operational amplifier, a second input terminal of said operational amplifier is supplied with a predetermined bias voltage, and a detection capacity element is connected in parallel to said operational amplifier.

7. A solid-state imaging device comprising:
   a plurality of pixels each generating an electrical signal corresponding to an amount of incident light;
   a capacitance connected to said pixel for accumulating signal charges of an amount corresponding to said electrical signal;
   a signal charge detector for detecting signal charges accumulated in said capacity; and
   a switch composed of an insulating gate-type FET (field-effect transistor) having a channel between first and second main electrodes, said first main electrode being connected to said capacitance, and said second main electrode being connected to said signal charge detector, wherein said switch is arranged such that an area of said first main electrode in contact with said channel is larger than an area of said second main electrode in contact with said channel, and having first and second drain regions located only at opposed sides of a source region.

8. A solid-state imaging device according to claim 7, wherein said first main electrode is disposed on both sides of said second main electrode across said channel.

9. A solid-state imaging device according to claim 7, wherein said second main electrode has at least four sides, and said first main electrode is disposed so as to surround at least two sides of said second main electrode across said channel.

10. A solid-state imaging device according to claim 7, wherein said first main electrode is disposed so as to surround most of said second main electrode.

11. A solid-state imaging device according to claim 7, wherein said first main electrode is disposed so as to completely surround said second main electrode.

12. A solid-state imaging device according to claim 7, wherein said signal charge detector includes an operational amplifier, said horizontal signal line is connected to a first input terminal of said operational amplifier, a second input terminal of said operational amplifier is supplied with a predetermined bias voltage, and a detection capacity element is connected in parallel to said operational amplifier.

13. The solid state imaging device of claim 1, further comprising a plurality of said switches located on opposed sides of a horizontal signal line.

14. The solid state imaging device of claim 13, further comprising a second horizontal signal line and a second signal detector connected to said second horizontal signal line.

15. The solid state imaging device of claim 7, further comprising a plurality of said switches located on opposed sides of a horizontal signal line.

16. The solid state imaging device of claim 15, further comprising a second horizontal signal line and a second signal detector connected to said second horizontal signal line.

* * * * *